US011778777B2

(12) United States Patent
Gao

(10) Patent No.: US 11,778,777 B2
(45) Date of Patent: Oct. 3, 2023

(54) ELECTRONICS RACK DISTRIBUTION SYSTEM WITH LEAKING DETECTION UNIT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 136 days.

(21) Appl. No.: 17/463,833

(22) Filed: Sep. 1, 2021

(65) Prior Publication Data

US 2023/0060854 A1    Mar. 2, 2023

(51) Int. Cl.
*H05K 7/20* (2006.01)
*G01M 3/16* (2006.01)

(52) U.S. Cl.
CPC ........ *H05K 7/20272* (2013.01); *G01M 3/165* (2013.01); *H05K 7/20781* (2013.01)

(58) Field of Classification Search
CPC ........... H05K 7/20272; H05K 7/20781; H05K 7/20818; H05K 7/20763; H05K 7/208; H05K 7/20327; H05K 7/20536–20836; G01M 3/165
See application file for complete search history.

(56) References Cited

U.S. PATENT DOCUMENTS

| | | | |
|---|---|---|---|
| 2014/0202678 A1* | 7/2014 | Goth | H05K 7/20763 165/200 |
| 2016/0270267 A1* | 9/2016 | Chainer | H05K 7/20781 |
| 2017/0181329 A1* | 6/2017 | Shelnutt | H05K 7/20781 |
| 2019/0364699 A1* | 11/2019 | Gao | H05K 7/20763 |
| 2020/0163251 A1* | 5/2020 | Chopra | H05K 7/20636 |
| 2022/0046828 A1* | 2/2022 | Miyamura | H05K 7/20763 |
| 2022/0338384 A1* | 10/2022 | Hogan | H05K 7/20272 |
| 2023/0052992 A1* | 2/2023 | Chigullapalli | H05K 7/20272 |

* cited by examiner

*Primary Examiner* — Stephen S Sul
(74) *Attorney, Agent, or Firm* — WOMBLE BOND DICKINSON (US) LLP

(57) ABSTRACT

Methods, systems, and devices for designing and implementing cooling fluid distribution in a computing environment such as a data center as disclosed. The disclosed design may reduce the impact cooling fluid leaks may have on the computing environment and other rack based systems. The disclosed methods and systems may include structures for containing cooling fluid leaks and detecting cooling fluid leaks. The structures may be movable between positions in which connectors for forming fluid connections are exposed and positions in which the connectors are contained. Containing and detecting cooling fluid leaks may allow for proactive action prior to significant damage to the computing environment.

20 Claims, 13 Drawing Sheets

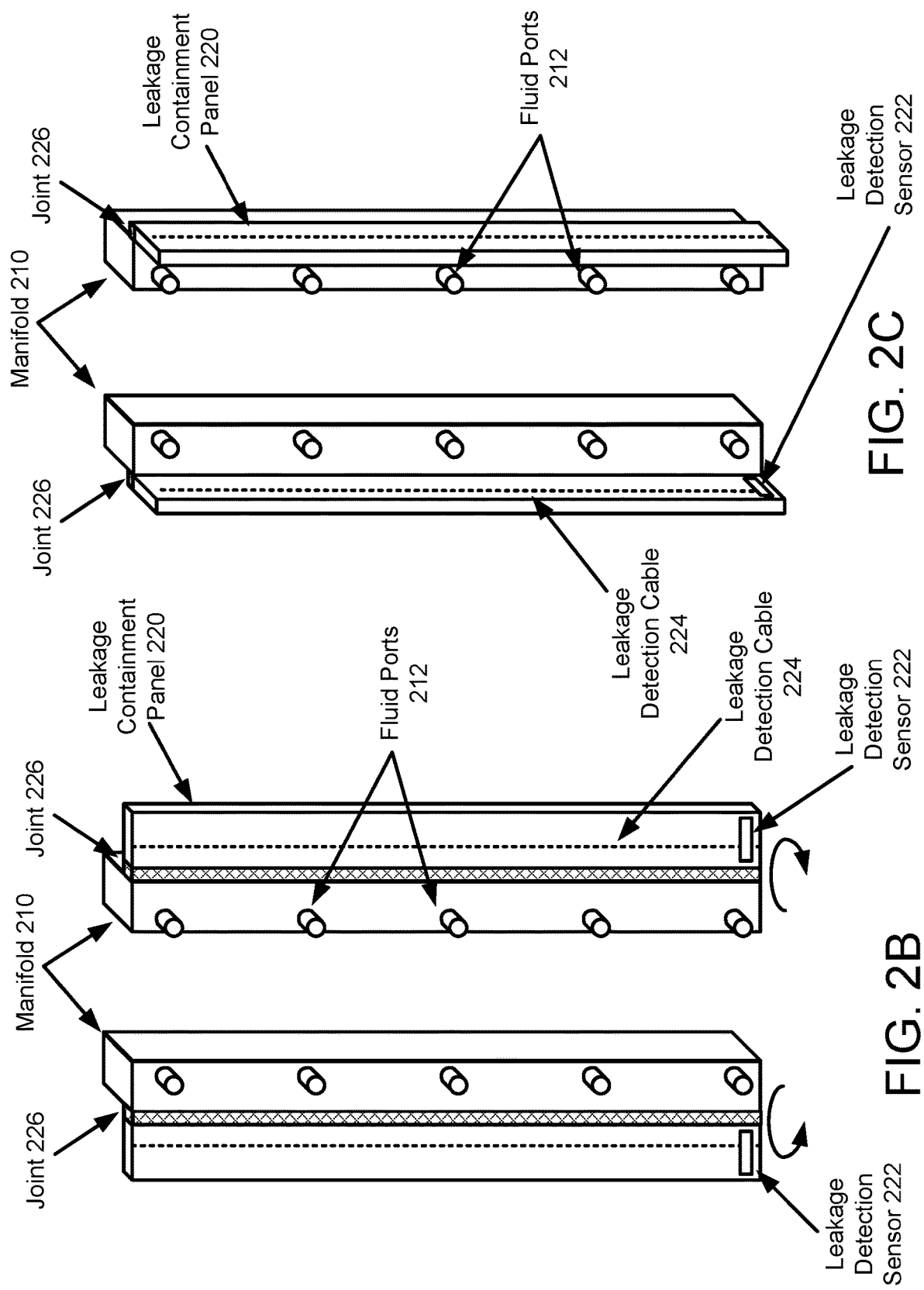

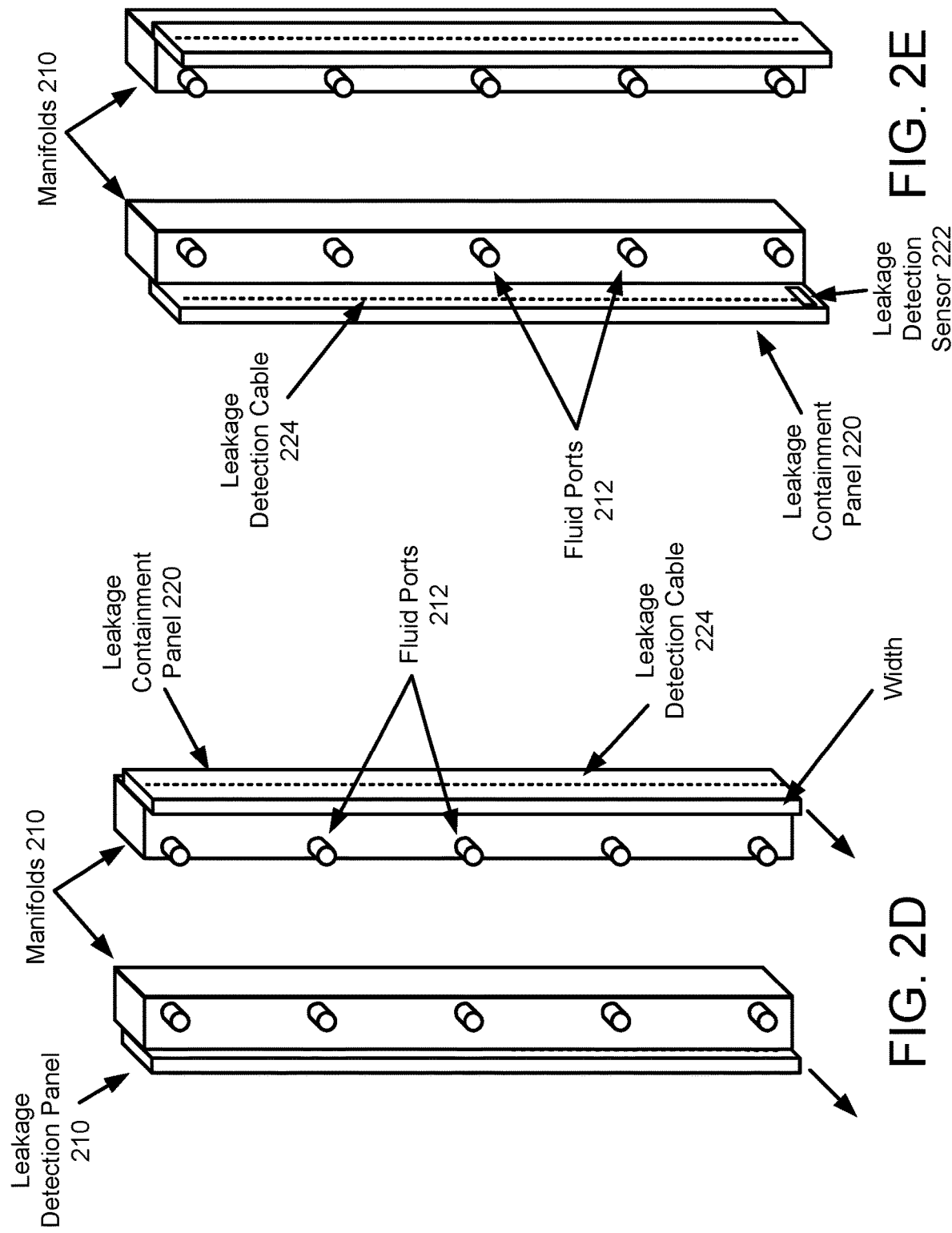

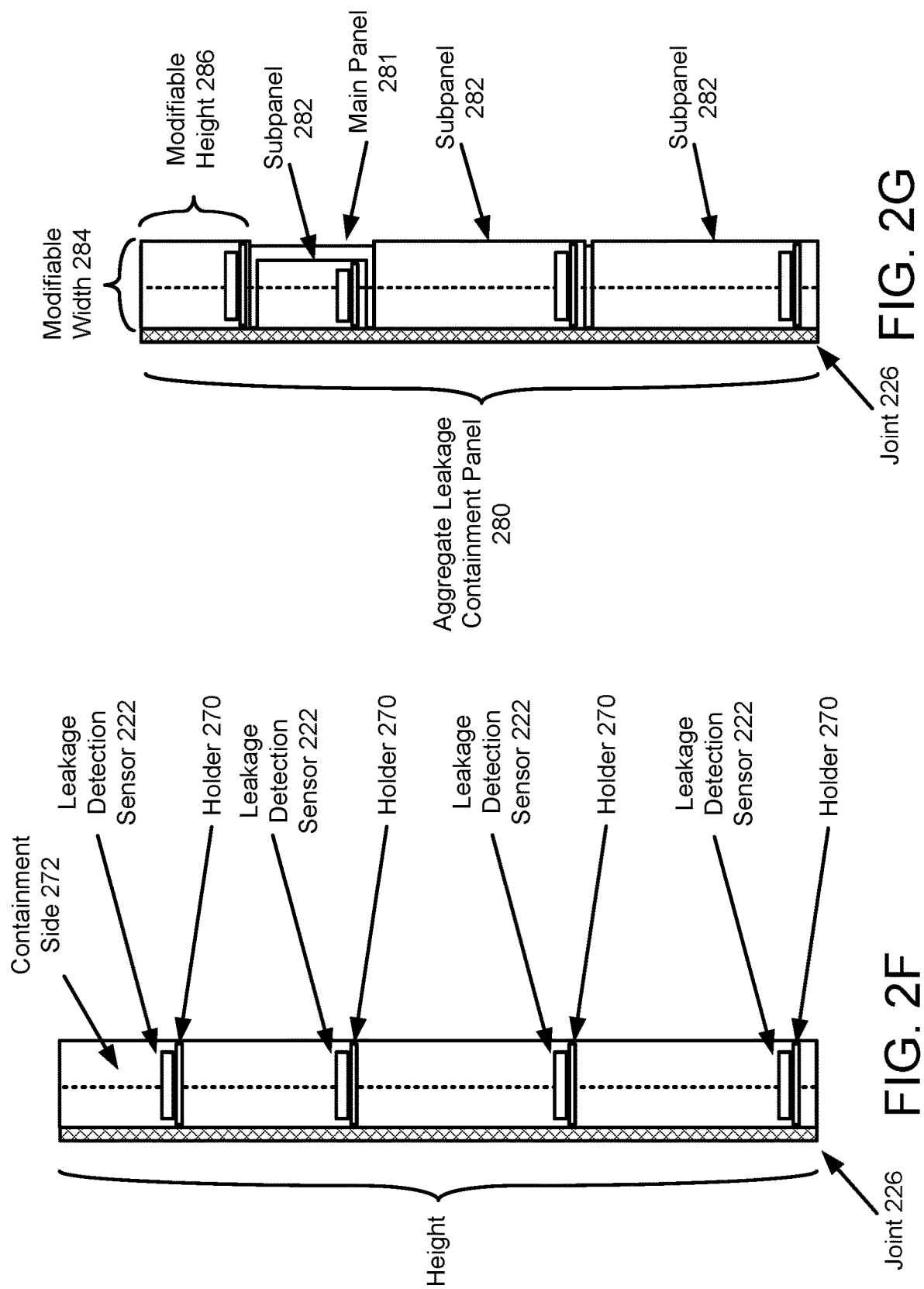

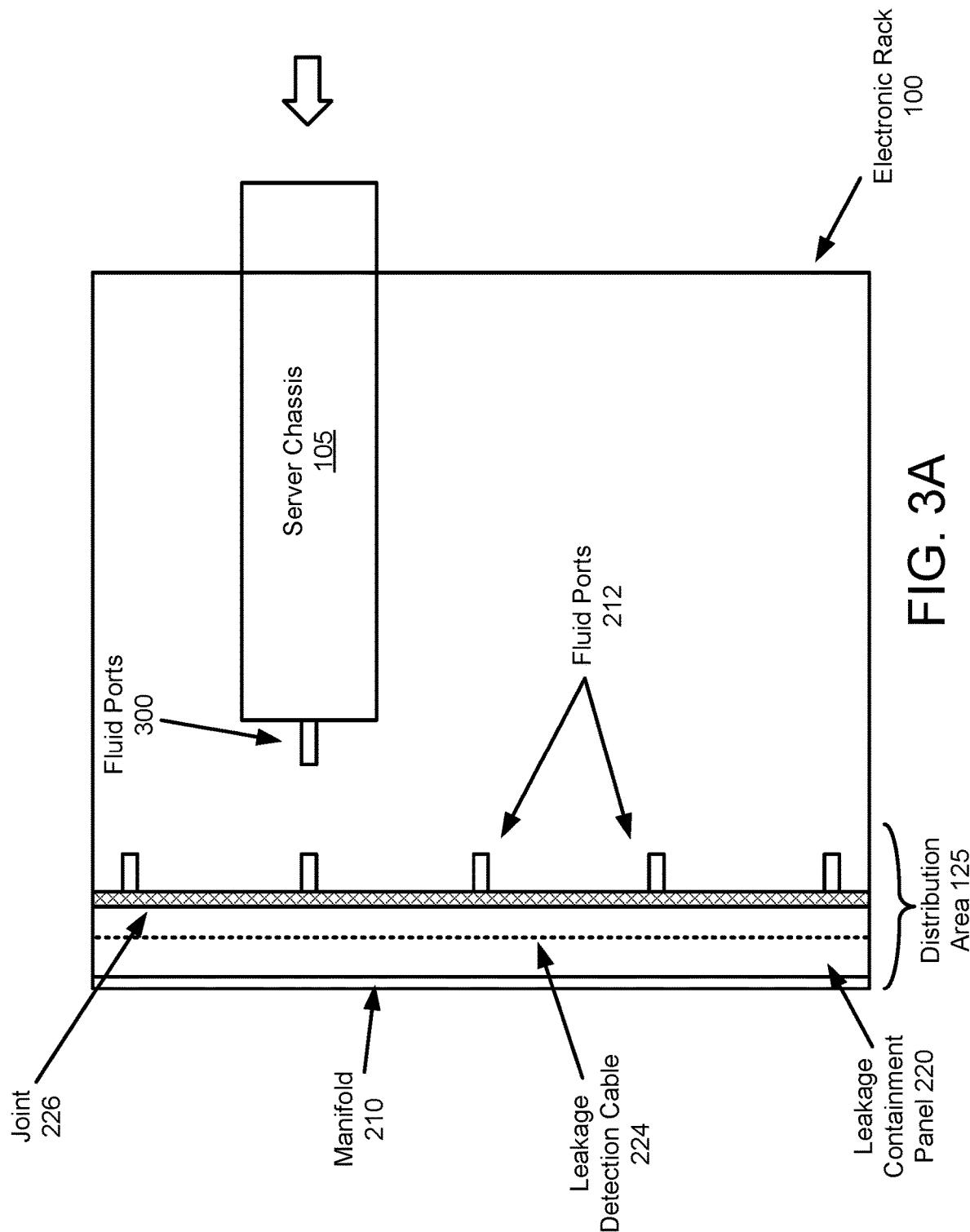

ELECTRONICS RACK DISTRIBUTION SYSTEM WITH LEAKING DETECTION UNIT

FIELD OF THE INVENTION

Embodiments of the present invention relate generally cooling system design for server thermal management. More particularly, embodiments of the invention relate to containment, detection, and management of cooling fluid leaks for server liquid cooling.

BACKGROUND

Cooling is a prominent factor in a computer system and data center design. The number of high performance electronics components and devices such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime.

Device density in a computing environment may contribute to the performance of the environment. For a given space, the performance of a computer system in the space may be limited by the number of electronic components that may be positioned in the space. To increase the performance of a computer system in a given space, electronic components may be placed close to other components used to dissipate the heat generated by the components.

Segregating and isolating the fluid system and hardware in an electronics rack is useful to prevent any leaked fluid contained within them to get in contact with other components or systems in the rack, such as power delivery systems.

BRIEF DESCRIPTION OF THE DRAWINGS

Embodiments of the invention are illustrated by way of example and not limitation in the figures of the accompanying drawings in which like references indicate similar elements.

FIG. 2B shows a second diagram of a cooling fluid distribution system according to one embodiment.

FIG. 2C shows a third diagram of a cooling fluid distribution system according to one embodiment.

FIG. 2D shows a fourth diagram of a cooling fluid distribution system according to one embodiment.

FIG. 2E shows a fifth diagram of a cooling fluid distribution system according to one embodiment.

FIG. 2F shows a first diagram of a leakage containment panel according to one embodiment.

FIG. 2G shows a second diagram of a leakage containment panel according to one embodiment.

FIG. 3A shows a first side view diagram of an electronic rack, a cooling fluid distribution system, and a server chassis according to one embodiment.

DETAILED DESCRIPTION

Figure 1:
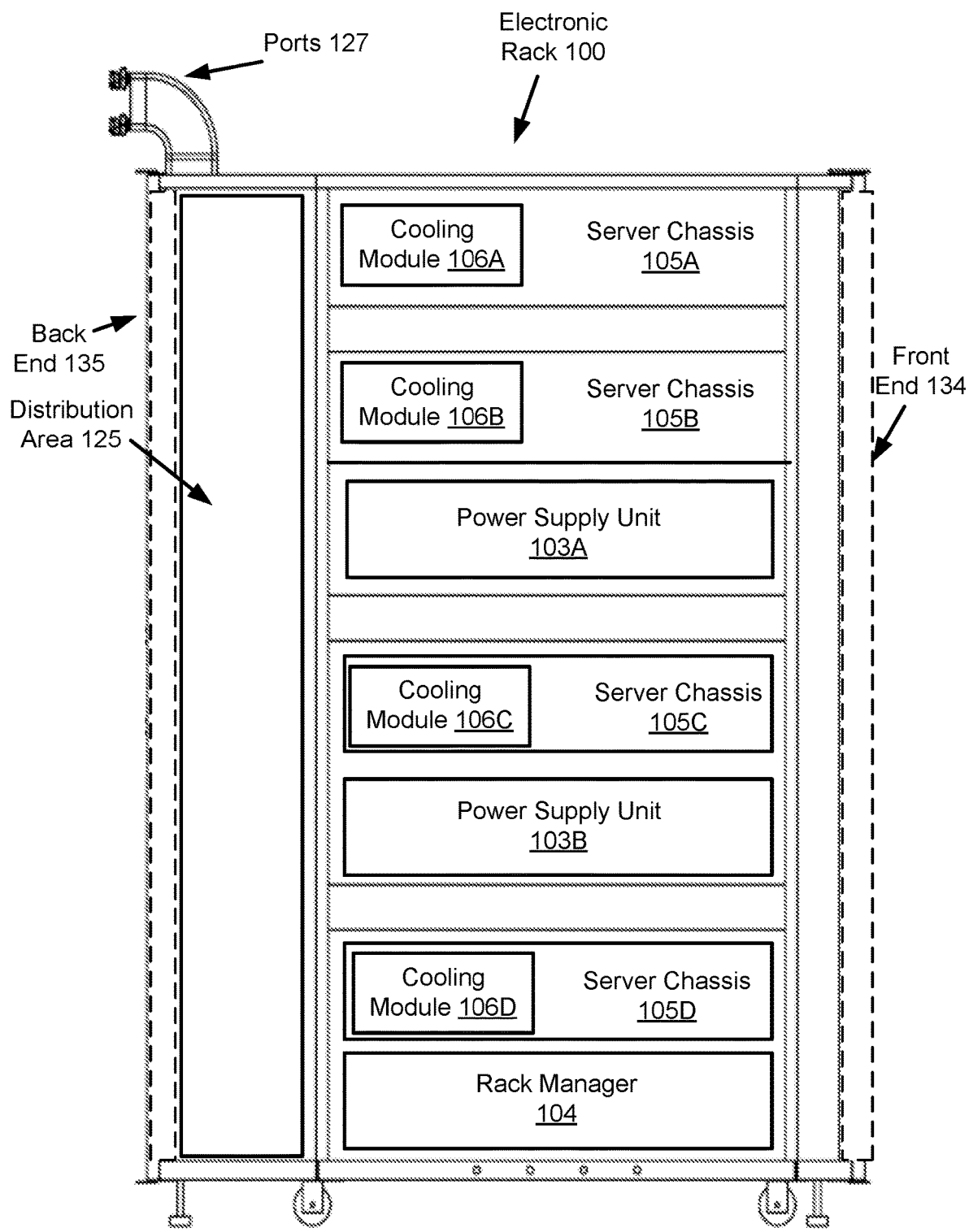
FIG. 1 shows a diagram of an electronic rack according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment", "an embodiment", or "one or more embodiments" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for managing cooling fluid distribution in a computing environment such as a data center. The disclosed methods may reduce the impact cooling fluid leaks may have on the computing environment and facilitate designs of computing environments that are more reliable when faced with cooling fluid leaks. To reduce the impact of cooling fluid leaks on computing environments, the system may include movable panels (e.g., sometimes refer to as "leakage containment panels" below) to segregate cooling fluid distribution components from other components. Segregation of these cooling fluid distribution components may contain cooling fluid to reduce the impact of leaks of the cooling fluid on other components.

Portions of the cooling fluid distribution components that may be more likely to leak cooling fluid may be contained with the segregations. The containments may prevent cooling fluid (leaked from the portions of the cooling fluid distribution components in the containments) from impacting other devices. Portions of server chassis or other components that are more likely to leak cooling fluid may also be positioned within the containments. For example, fluid ports on the cooling fluid distribution components and server chassis used to circulate cooling fluid to the server chassis may be positioned in the containments while the server chassis are positioned in electronic racks.

The movable panels may also be movable to expose fluid ports of the cooling fluid distribution components. The fluid ports may be exposed to facilitate formation of fluid connections with server chassis or other components that may utilize cooling fluid for cooling purposes when the server chassis are initially positioned in an electronic rack. After the server chassis are positioned in the electronic rack, then the movable panels may be moved to contain the fluid ports of the cooling fluid distribution components and server chassis.

In addition to containing leaked cooling fluid, the system may also monitor for and take action in response cooling fluid leaks. To monitor for cooling fluid leaks, leakage detection sensors and/or leakage detection cables may be positioned with the movable panels. These sensors and cables may detect the presence of certain materials such as cooling fluid and report such detections to rack managers or other management entities. These managers/other entities may automatically take action to reduce the impact of cooling fluid leaks.

In one embodiment, a cooling fluid distribution system includes a rack manifold for circulating cooling fluid to devices populated in the rack; blind mating connectors positioned on the rack manifold, in fluid communication with the rack manifold, and that fluidly connect the devices with the rack manifold; leakage containment panels attached to the rack manifold and positioned on two sides of the blind mating connectors, each of the leak detection panels being movable between an idle position and an active position; and a leakage detection sensor to detect when the cooling fluid leaks from a fluid connection between the blind mating connectors and the devices.

The cooling fluid distribution system may also include a first joint which attaches a first leakage containment panel of the leakage containment panels and the rack manifold, the first joint for rotation of the first leakage containment panel between the idle position and the active position. The blind mating connectors may be accessible from a side corresponding to the first joint while the first leakage containment panel is in the idle position.

The cooling fluid distribution system may also include a second joint which attaches a second leakage containment panel of the leakage containment panels and the rack manifold, the second joint for rotation of the second leakage containment panel between the idle position and the active position. The first leakage containment panel and the second leakage containment panel may form a containment while the first leakage containment panel and the second leakage containment panel are in the active position, the containment may limit flow of the cooling fluid out of the containment to prevent cooling fluid from being sprayed on other components due to a leak between one of the blind mating connectors and one of the devices.

The blind mating connectors may be accessible from sides corresponding to the first joint and the second joint while the first leakage containment panel and the second leakage containment panel are in the idle position, and the containment may be removed while the first leakage containment panel and the second leakage containment panel are in the idle position. In one embodiment, the connectors can be manual mating dripless quick disconnectors, the connectors can be manually engaged or disengaged when the leakage containment panels are in the idle position.

The cooling fluid distribution system may also include a leakage detection cable positioned with one of the leakage containment panels to detect when the cooling fluid reaches the one of the leakage containment panels.

The leakage detection sensor may be operably connected to the leakage detection cable, and may report a leak of the cooling fluid is present when the leakage detection cable detects the cooling fluid. The leakage detection sensor may report the leak of the cooling fluid to a rack management controller that manages flow of the cooling fluid in an electronic rack in which the cooling fluid distribution system is positioned.

The devices populated in the rack may be server chassis in which computing components are positioned with cooling modules that cool the computing components with the cooling fluid.

By implementing a system as discussed above, a hardware design for cooling fluid delivery, cooling fluid containment, cooling fluid leak detection, and/or cooling fluid leak management may be provided. The hardware design may be easy to integrate and implement. The hardware design may also be compatible with current hardware and systems allowing the hardware designs to be used with current hardware and systems. In particular, the hardware designs may be compatible with different electronic rack configurations that may place components at a variety of locations. Similarly, the hardware designs may be compatible with different server chassis configurations. For example, the structures the movable panels and other components may be adjusted in shape, size, and other characteristics to be used with server chassis of varying size and shape. Additionally, the hardware design may allow for a variety of different connector types to be utilized. For example, the methods of containing and managing cooling fluid may be independent of the particular connector type utilized in a server chassis or electronic rack. The hardware design may also allow for detection of a broad range of different type of cooling fluid leaks independent of fluid port connector types utilized for cooling fluid distribution.

FIG. 1 is block diagram illustrating an electronic rack according to one embodiment. Electronic rack 100 may represent any of the electronic racks as described throughout this application. According to one embodiment, electronic rack 100 includes, but is not limited to, one or more power supply units 103A-103B, a rack management unit 104, and one or more server chassis 105A-105D (collectively referred to as server chassis 105).

Server chassis 105 may be inserted into an array of server slots (e.g., standard shelves) respectively from front end 134 or back end 135 of electronic rack 100. Although there are four server chassis 105A-105D shown here, additional or fewer server chassis 105 may be maintained within electronic rack 100. Also note that the particular positions of power supply units 103A-103B, rack manager 104 (e.g., a rack management controller), and/or server chassis 105 are shown for purposes of illustration only; other arrangements or configurations of these components may also be implemented. In one embodiment, electronic rack 100 can be either open to the environment or partially contained by a rack container.

Each of server chassis 105 may include one or more computing components (e.g., central processing units (CPUs), general/graphic processing units (GPUs), memory, and/or storage devices). Each computing component may perform data processing tasks. One or more of the computing components may execute software stored in a storage device or other persistent storage medium. The software may be loaded into the memory, and executed by one or more processors (e.g., computing components) to perform the data processing tasks.

Server chassis 105 may include a host server (referred to as a host node) coupled to one or more compute servers (also referred to as computing nodes, such as CPU server and GPU server, any of which may be implemented with the server chassis 105). The host server (having one or more CPUs) may interface with clients over a network (e.g., Internet) to receive a request for a particular service such as storage services (e.g., cloud-based storage services such as backup and/or restoration), processing services, or any other type of services.

In response to the request, the host server may execute an application to perform certain operations (e.g., image processing, deep data learning algorithms or modeling, etc., as, for example, a part of a software-as-a-service (SaaS) platform). In response to the request, the host server may distribute the tasks to one or more of the computing nodes or compute servers (e.g., having one or more CPUs, GPUs, other types of special purposes hardware devices, etc.) managed by the host server. The compute servers and/or host server may perform the tasks, which may consume electrical power and generate heat during the operations carried out to perform the tasks.

To manage the heat generated during operation, any of server chassis 105 may include any number of cooling modules 106A-106D (collectively, cooling modules 106). The cooling modules 106 may include cold plates to cool corresponding computing components (e.g., processors, memory devices, persistent storage devices, communications devices, special purpose hardware devices such as application specific integrated circuits, graphics processing units, etc.). In one embodiment, the cooling modules 106 are fluid cooling devices that utilize cooling fluid to cool the computing components. The cooling modules 106 may receive a cooling fluid (e.g., from components positioned in distribution area 125) and transfer heat generated by the computing components into the cooling fluid thereby cooling the computing components. The cooling fluid may be circulated through the cooling modules 106 thereby removing heat from server chassis 105. The cooling fluid may be circulated to other systems (not shown) to discharge the removed heat from the cooling fluid thereby allowing the cooling fluid to be circulated back to the cooling modules 106 for heat removal.

To provide power to server chassis 105 and manage heat generated by the devices (computing components and/or other devices) in the server chassis 105, electronic rack 100 may include distribution area 125. Components usable to (i) distribute power to various components (e.g., server chassis 105) positioned in electronic rack 100 and (ii) remove heat from various components positioned in electronic rack 100 may both be positioned in distribution area 125. In an embodiment, the components that provide these respective functions are segregated from one another in distribution area 125. Segregating these components from one another may reduce the likelihood of these components impacting the operations of the other components.

For example, consider a scenario where power distribution components and cooling fluid distribution components are both positioned in distribution area 125, but are not segregated from each other. If cooling fluid escapes from the cooling fluid distribution components, then the cooling fluid may disrupt the function of the power distribution components. However, if these components are segregated from one another, then even cooling fluid that escapes from the cooling fluid distribution components (e.g., due to leaks or other issues) may be unlikely to disrupt the operation of the power distribution components by virtue of the segregation between these components.

To facilitate segregation of these components from one another, the components positioned (e.g., cooling fluid distribution components) in the distribution area 125 may include structural features usable to form walls or other structures for physically segregating the components from each other. For example, the components positioned in the distribution area may include portions that may rotate, translate, and/or otherwise move to form walls that divide the distribution area 125 into different areas. These different areas may operate as containments that limit or prevent materials from moving between the different areas.

To manage segregation between components in distribution area, sensors may be positioned with the components in the distribution area. The sensors may detect the presence of certain materials and report the detections to rack manager 104. For example, the sensors may be adapted to detect the presence of cooling fluid and report the detection to rack manager 104.

Rack manager 104 may manage the operation of components in electronic rack 100. For example, rack manager 104 may manage the flow of cooling fluid to server chassis 105, may manage the power delivered to server chassis 105, and may otherwise manage the operation of the electronic rack 100. To do so, rack manager 104 may monitor the sensors in distribution area 125 for reports of certain material detections. When reports of certain material detections are received, the rack manager 104 may automatically take action to manage the electronic rack 100. For example, the rack manager 104 may (i) report the detection to one or more administrators of the rack (e.g., by sending an electronic communication indicating that presence of a material has been detected), (ii) modify the operation of one or more of the server chassis 105 (e.g., my requesting/instructing that the computing components in server chassis change their operation), (iii) modify the operation of one or more of the power supply units 103 (e.g., to stop/limit/change power being distributed with power distribution components such as busbars in distribution area 125), (iv) modify distribution of cooling fluid with components positioned in distribution area 125 (e.g., by requesting/instructing changes in operation of pumps, valves, and/or other devices that control cooling fluid flow through components positioned in distribution area 125), and/or (v) perform any other type of action usable to manage the electronic rack 100 when a material is detected in distribution area 125.

Depending on the type of electronic rack, the components to be positioned in the electronic rack 100, and other factors, the distribution area 125 may have varying shapes, configurations, and other characteristics to accommodate these components. For example, the shape, layout, and design of the distribution area 125 may depend on the type and quantity of cooling liquid distribution components to be placed in it, the types and shapes of server chassis or other components to be placed in a main region of the electronic rack, the number, shape, and size of leakage containment panels to be positioned in distribution area 125, etc. Other factors may contribute to the characteristics of the distribution area 125 without departing from embodiments disclosed herein. Similarly, the components to be positioned in the distribution area 125 may also vary depending on the configuration of the electronic rack, components therein, and other design considerations.

Power supply units 103A-103B (collectively, power supply units 103) may receive power from an external supply (such as a power grid), convert it to a type of power that is compatible with other components in electronic rack 100 such as server chassis 105 and rack manager 104, and distribute the converted power to other components such as server chassis 105, rack manager 104, and/or other components. For example, power supply units 103 may receive alternating current from an external supply, convert the alternating current to direct current, and distribute the direct current to the server chassis 105, rack manager 104, and/or other components with power distribution components (e.g., one or more busbars) positioned in distribution area 125.

In some embodiments, one or more of the components in electronic rack 100 does not utilize the power supply units 103 for power purposes. For example, these other components may utilize a utility grid or another device in electronic rack 100 for power purposes.

Electronic rack 100 may also include ports 127 or other structures that allow cooling fluid and/or power to flow through distribution area 125 to the server chassis 105, power supply units 103, and/or other components positioned in electronic rack 100. A portion of the ports 127 may attach or be attached to cooling fluid distribution components positioned in distribution area 125 to allow sources of cooling fluid (not shown) to circulate cooling fluid through the cooling fluid distribution components positioned in distribution area 125. Similarly, power cords or other structures usable to attach the power supply units 103 to utility grids or other power providers (not shown) may also run through distribution area 125 and/or through ports 127.

Figure 2A:
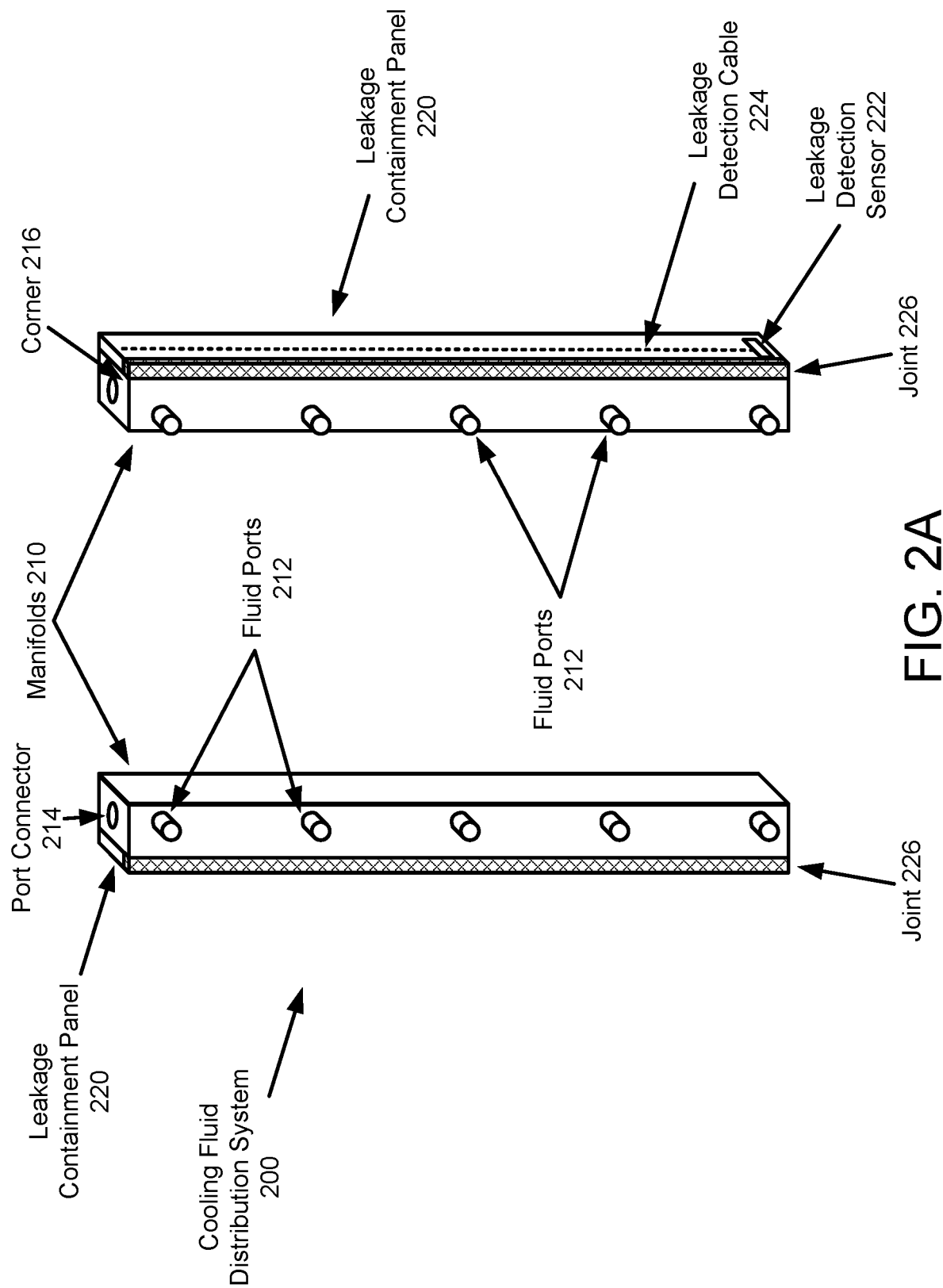
FIG. 2A shows a first diagram of a cooling fluid distribution system according to one embodiment.

Turning to FIG. 2A a diagram of an example cooling fluid distribution system 200 in accordance with one or more embodiments is shown. The cooling fluid distribution system 200 may be positioned in distribution area 125 of electronic rack 100. For example, cooling fluid distribution system 200 may be positioned in distribution area 125 prior to positioning of server chassis 105 in the electronic rack 100 or may be positioned in distribution area 125 after server chassis 105 are positioned in electronic rack 100.

Cooling fluid distribution system 200 may (i) distribute cooling fluid to one or more components positioned in an electronic rack, (ii) segregate distribution area 125 into different areas, (iii) contain (partially or completely) certain materials such as cooling fluid within the different areas of distribution area 125 and/or (iv) monitor and/or report detections of certain materials. To provide its functionality, cooling fluid distribution system 200 may include one or more manifolds 210 (also referred to as "rack manifolds") and one or more leakage containment panels 220. Each of these components is discussed below.

The one or more manifolds 210 may provide for cooling fluid distribution. To distribute cooling fluid, the manifolds 210 may exchange cooling fluids (e.g., provide warmed cooling fluid to a source and received cooled cooling fluid from the source) with a cooling fluid source (e.g., through ports 127 in fluid communication with the cooling fluid source). The cooled cooling fluid may be distributed to server chassis 105 and/or other components positioned in an electronic rack and warmed cooling fluid may be received from the server chassis 105 and/or other components. The manifolds 210 may include tubes, manifolds, fluid ports 212, port connectors 214 and/or other components usable to form fluid connections, loops, and/or fluid flow management structures usable to circulate cooling fluid from the cooling fluid source to components such as server chassis 105 positioned in electronic rack 100. In one embodiment, different manifolds perform different functions. For example, one manifold may provide for supplying cooled cooling fluid while another manifold may provide for return of warmed cooling fluid to a cooling fluid source. Additionally, while the manifolds 210 are illustrated in FIG. 2A as being separate components, multiple manifolds may be combined as a module (e.g., fixedly attached to one another, may include a single unitary body, etc.).

The port connectors 214 may include mating connectors to connect with ports 127. The manifolds 210 may exchange cooling fluid with a cooling fluid source (not shown) with the port connectors 214. The port connectors 214 and fluid ports 212 may be connected to tubing, manifolds, and/or other structures. The manifolds 210 may include any number of port connectors 214.

In one embodiments, fluid ports 212 include blind mating connectors for forming fluid connections with other fluid ports (e.g., on server chassis). The blind mating connectors may allow for fluid connections to be formed when server chassis or other components are positioned in an electronic rack. For example, when server chassis are moved into electronic rack 100 from a front side, the fluid ports 212 may automatically connect with corresponding fluid ports on the server chassis 105 (or other components that are moved into the electronic rack 100). The fluid connections may provide for circulation of cooling fluid to cooling modules positioned in the server chassis 105. Consequently, the port connectors 214 and fluid ports 212 may provide for circulation of cooling fluid between a cooling fluid source and components such as server chassis positioned in electronic rack 100.

However, the presence of the cooling fluid in the manifolds 210 may present a hazard to other devices such as power busbars or other components positioned in distribution area 125. For example, cooling fluid that leaks or otherwise escapes from manifolds 210 may impact these other components by changing their electrical characteristics (e.g., shorting them out), corroding them, or otherwise modifying them. These modifications may reduce the ability of these components to provide their functionalities. For example, if the cooling fluid shorts out a busbar or server chassis, then the electronic rack may be subject to significant or catastrophic damage.

To reduce the impact of cooling fluid leaks, leakage containment panels 220 may be positioned with the manifolds 210. The leakage containment panels 220 may include physical structures such as, for example, panels, sheet, or other elements for segregating portions of distribution area 125 from other portions. The segregated areas may operate as containments for cooling fluid or other materials that may be present in the segregated areas.

The leakage containment panels 220 may be implemented to the manifolds 210 in a manner that allows the leakage containment panels 220 to move between at least two positions (e.g., a first position and a second position). In a first position (e.g., a retracted position or idle position), the leakage containment panels 220 may generally expose the fluid ports 212 and/or other portions of the manifolds 210 to facilitate formation of fluid connections between the fluid ports 212 and fluid ports of other components such as server chassis 105.

In a second position (e.g., an extended position or active position), the leakage containment panels 220 may generally extend away from the manifolds 210 to segregate the fluid ports 212 (and/or other portions of the manifolds 210) from other components positioned in the distribution area 125. For example, in the second position the leakage containment panels 220 may form walls that extend from a rear of a server chassis to a portion of the manifolds 210 and/or a rear of the electronic rack 100. The walls may divide the distribution area 125 into regions that are segregated from one another. The segregation region in which the fluid ports 212 are positioned may act as a containment. If cooling fluid leaks from the fluid ports 212 or other portions of the manifolds 210 in the segregation region, the walls formed with the leakage containment panels may prevent (or reduce the flow rate) flow of the cooling fluid out of the segregation region.

The walls may, for example, direct leaked cooling fluid away from server chassis, power busbars, and/or other components at least partially positioned in distribution area 125 that may be impacted by leaked cooling fluid. For example, the walls formed with the leakage containment panels 220 may direct the leaked cooling fluid downward towards a lower portion of the electronic rack 100. Components that may be impacted by the leaked cooling fluid may not be positioned in the lower portion. Accordingly, the leaked cooling fluid so directed may have a limited or negligible impact on the operation of components positioned in the electronic rack. The lower portion may form an area to design leakage detection efficiently.

The leakage containment panels 220 may move via any motion (e.g., translation, rotation, a combination of rotation and translation, etc.) between the two positions.

In one embodiment, the leakage containment panels 220 are connected to the manifolds 210 with joints 226. The joints 226 may be rotational joints that facilitate rotation of the leakage containment panels 220. The rotation of the leakage containment panels 220 about the joints 226 may allow the leakage containment panels to move between the two positions. In the first position, the leakage containment panels 220 may be positioned against a surface of the manifolds 210. In the second position, the leakage containment panels 220 may be extended away from the manifolds 210. These two position may, for example, be rotated by approximately 180° with respect to one another about the joints 226. For example, in FIG. 2A, the leakage containment panels 220 are illustrated in an example of a first position. Refer to FIGS. 2B and 2C for details regarding rotation from the example first position to an example second position.

While the leakage containment panels 220 are illustrated in FIG. 2A and subsequent figures as continuous panels, the leakage containment panels 220 may be implemented with a variety of sections that are separately movable (e.g., rotatable, may slide with respect to manifolds or other structures to which the leakage containment panels are connection, etc.). The different sections that are separately movable may have different widths to accommodate the shapes or other characteristics of server chassis or other structures. For example, different server chassis may have different depths, the different sections corresponding to the different server chassis may have widths, lengths, and/or heights that correspond to the depths or other characteristics of the server chassis to facilitate containment formation.

The joints 226 may be connected to portions of the manifolds 210 to facilitate rotation of the leakage containment panels 220 about corresponding portions of the manifolds 210. For example, the joints 226 may connect to corners 216 of the manifolds thereby allowing the leakage containment panels 220 to be positioned with a side of the manifolds while in the first position and extend away from the manifolds while in the second position.

In one embodiment, the manifolds 210 include (or there are positioned with the manifolds) a pair of joints 226. The pair of joints 226 may be positioned on opposite sides of the manifolds 210. Each of the pair of joints 226 may be connected to respective corners of the manifolds (or surfaces of the manifolds 210 near the corners). The pair of joints 226 may be capable of rotating in different directions about the joints 226 to allow the leakage containment panels 220 to both be extended away from the manifolds 210 on a same side of the manifolds 210.

To facilitate detection of certain materials, the cooling fluid distribution system may include leakage detection sensors 222 and/or leakage detection cables 224. The leakage detection sensors 222 may be positioned with (e.g., positioned on or integrated as a part of) corresponding leakage containment panels 220. The leakage detection sensors 222 may be able to detect the presence of certain materials such as cooling fluid. For example, the leakage detection sensors 222 may include sensors capable of measuring capacitance, resistance, or other properties that may be modified by the presence of the certain materials. The leakage detection sensors 222 may be operably connected to the leakage detection cable 224 and/or a rack manager of the electronic rack 100. The leakage detection sensors 222 may report detections of certain materials to the rack manager of the electronic rack 100. The rack manager and leakage detection sensors 222 may be operably connected to each over via one or more wired or wireless connections and/or networks.

The leakage detection cables 224 may be a physical device for detecting the presence of certain materials such as cooling fluid. In these figures and those that follow, the leakage detection cables 224 are drawn as dashed lines over the faces of leakage containment panels. These dashed lines should be understood as indicating that the leakage detection cables 224 may be present anywhere on these components and do not define a particular location and positioning. For example, the leakage detection cables 224 may be positioned on the side surfaces of the leakage containment panels and the bottoms of the leakage containment panels to facilitate cooling fluid leak detection.

The leakage detection cables 224 may extend over the leakage containment panels 220 such that the presence of certain materials on various portions of the leakage detection cables 224 may be detected by the leakage detection sensors 222. For example, the leakage detection cables 224 may be implemented as a wire pair having a capacitance and a resistance when the certain materials are not present. When the certain materials are present, the capacitance and/or resistance of the wire pair may change. The wire pair may extend along various surface and/or through the bodies of the leakage containment panels. The leakage detection sensors 222 may include resistance and/or capacitance sensors capable of measuring and detecting changes in the resistance and/or capacitance of the wire pair thereby facilitate detection of certain materials on the leakage containment panels 220. The leakage detection cable 224 and leakage detection sensor 222 may operate on difference detection methodologies (e.g., using other property sensitivities to certain materials as a detection basis) without departing from embodiments disclosed herein.

While leakage detection sensors 222 and leakage detection cables 224 for each leakage containment panel 220 are illustrated in FIG. 2A, a cooling fluid distribution system may include other numbers/relationships of these components without departing from embodiments disclosed herein. For example, only some leakage containment panels may include these components. In another example, multiple leakage detection cables 224 may be operably connected to a single leakage detection sensor 222 (e.g., cables from multiple panels may be linked to a single sensor position on one of the panels). Still further, these components may be positioned in other locations without departing from embodiments disclosed herein. For example, the leakage detection sensors 222 may be positioned with the manifolds 210 (or on portions of an electronic rack) rather than with the leakage containment panels 220.

In one embodiments, the panels forming the leakage containment panels 220 include holders and/or features (e.g., indentations, ledges, etc. which may be used to position sensors and facilitate submersion of the sensors when cooling fluid is leaking nearby) for positioning leakage detection sensors 222 at one or more heights along the leakage containment panels 220. For example, the holders and/or other features may be placed at different positions along the path delineated by the dashed line in FIG. 2A. Leakage detection sensors 222 positioned with these holders and/or features may allow for leaking cooling fluid to submerge corresponding leakage detection sensors 222 thereby allowing for detection of the leaking. This approach may allow for the use of more economically efficient sensors and/or improved leak detection (e.g., higher accuracy) by causing the leakage detection sensors 222 to be more likely to be submerged (which may allow the sensor to better detect the presence of cooling fluid) when cooling fluid is leaking from components in distribution area 125. Refer to FIG. 2F for additional details regarding positioning of leakage detection sensors.

Turning to FIGS. 2B and 2C, diagrams of example cooling fluid distribution systems 200 in accordance with one or more embodiments are shown. For example, these figures may illustrate motion of leakage containment panels 220 as they move from a first position (e.g., as illustrated in FIG. 2A) to a second position (e.g., as illustrated in FIG. 2C).

As seen in FIG. 2B, the leakage containment panels 220 may rotate about the joints 226. The leakage containment panels 220 may be rotated about the joints to form containments for the fluid ports 212 and/or other structures. As seen in FIG. 2B, in one embodiment, one of the leakage containment panels 220 may rotate counter clockwise (e.g., on the left in FIG. 2B) while another leakage containment panel may rotate clockwise (e.g., on the right in FIG. 2B). In other words, these leakage containment panels may rotate in opposite directions.

As seen in FIG. 2C, in one embodiment, the leakage containment panels 220 rotate approximately 180° to move from the first position to the second position. The leakage containment panels 220 may rotate different amounts without departing from embodiments disclosed herein. For example, in some embodiments, the leakage containment panels may be partially rotate away from a surface of the manifolds 210 while in the first position.

In the second position, the leakage containment panels 220 may both extend away from the manifolds 210 thereby forming a containment (partial or complete) for the fluid ports 212, which may be positioned between the leakage containment panels 220 in the second position.

Turning to FIGS. 2D and 2E, diagrams of example cooling fluid distribution systems 200 in accordance with one or more embodiments are shown. As discussed above, the leakage containment panels 220 may move between the first and second position via other types of motion paths than that illustrated in FIGS. 2A-2C. In FIGS. 2D-2E, an example of a primarily translational movement path is shown.

As seen in FIGS. 2D and 2E, in some embodiments, the leakage containment panels 220 may be connected to the manifolds 210 with sliders (not shown) or other mechanisms for allowing the leakage containment panels 220 to substantially slide (e.g., rather than rotate) between the first position and the second position. For example, as seen in FIG. 2D, the leakage containment panels 220 may slide from being substantially positioned with a face of the manifolds 210 to being extended away from the manifolds 210 as shown in FIG. 2E. In one embodiment, the first and second positions in FIGS. 2D-2E are substantially similar or identical to those shown in FIGS. 2A-2C.

Turning to FIG. 2F, a diagram of a leakage containment panel in accordance with one or more embodiments is shown. The diagram of FIG. 2F may generally show a containment side 272 of a leakage containment panel. As seen in FIG. 2F, multiple leakage detection sensors 222 may be positioned along the height of the leakage containment panel. The leakage detection sensors 222 may be positioned on a containment side 272 of the leakage containment panel. The containment side 272 may be the side of the leakage containment panel that will be on an inside of a containment when the leakage containment panel is used to form a containment. For example, with respect to FIG. 2F which is discussed in greater detail below, the containment side 272 may be proximate to the fluid ports 212, 300 in the figure (as opposed to the other side of the leakage containment panels 220 which may face outward, way from containment 350.

In one more embodiments, the leakage detection sensors 222 and holders 270 are included in the leakage detection panels. For example, the holders 270 and leakage detection sensors 222 may be integrated into or otherwise may not extend outside of the leakage detection panels. These components may not extend outside of exterior surfaces of the leakage containments panels 220. In a scenario where the leakage containment panels 220 are implemented have, at least in part, a rectangular box shape, these components may not extend outside of the width, height, or depth of the box. These components may be similarly integrated with respect to leakage detection panels having different and/or more complicated shapes. For example referring to FIG. 2D which illustrates an example of a leakage containment panel 220 having a substantially rectangular box shape, the leakage detection sensors 220 and/or holders 270 may not extend outside of the width (labeled as "Width" in FIG. 2D).

Returning to the discussion of FIG. 2F, any number of leakage detection sensors 222 may be positioned along the height of the leakage containment panel. Each of the leakage detection sensors 222 may be positioned with a holder 270 that (i) positions the leakage detection sensor (e.g., by facilitating attachment to or support on the containment side 272) and/or (ii) facilitates submersion of the leakage detection sensor. For example, the holders 270 may be physical structures attached to or a part of the leakage containment panel. The holders 270 may include ledges, attachment points, and/or other features to facilitating maintaining positioning of the leakage detection sensors 222 with respect to the leakage containment panel. The holders 270 may also include bowls, rims, and/or other structures that facilitate submersion of the leakage detections sensors in leaking cooling fluid. For example, when cooling fluid is leaking near a holder, the holder may capture some of the leaking cooling fluid to form a pool of the cooling fluid that submerges a leakage detection sensor positioned with the holder. By doing so, the detection accuracy, sensitivity, repeatability, etc. of detection of cooling fluid leaks may be improved (e.g., because the leakage detection sensors 222 may have improved detection accuracy, sensitivity, repeatability, etc. when submerged (partially or entirely) when compared with when cooling fluid may only be running over or otherwise moving with respect to the leakage detection sensors).

Turning to FIG. 2G, a diagram of a leakage containment panel in accordance with one or more embodiments is shown. In one embodiment, the leakage containment panel shown in FIG. 2G is an aggregate leakage containment panel 280. The aggregate leakage containment panel 280 may be configured for use in a broad variety of use cases with various electronic rack configures and components positioned there. For example, different electronic racks may include a variety of server chassis and other devices with different depths, heights, and other characteristics when positioned in an electronic rack. To form a containment with these components, a leakage containment panel may need to be configurable or otherwise adaptable for different deployment scenarios. In one embodiment, the subpanels 282 are attached to a main panel 281.

To be configured for each of these use cases/deployment scenarios, the aggregate leakage containment panel 280 may include multiple subpanels 282. Each of these subpanels 282 may have shapes, size, widths, heights, and other characteristics (e.g., such as positioning of leakage detections sensors, holders, and other features thereon) corresponding to and/or complementary to features of an electronic rack and components therein. For example, the subpanels 282 may have different heights corresponding to different server chassis. In another example, the subpanels 282 may have different widths corresponding to different server chassis. The subpanels 282 may be aggregated together (e.g., to form a module with a joint or other attachment structure) to obtain the aggregate leakage containment panel 280. Each of the subpanels 282 may provide for the formation of a containment with a corresponding component such as a server chassis positioned in an electronic rack.

The positioning of leakage detection sensors 222, holders 270, and leakage detections cables with these subpanels 282 may provide for cooling fluid leak detection customized to corresponding deployment scenarios. Similarly, the size, shape, and other characteristics of the subpanels 282 may provide for containment formation customized to corresponding deployment scenarios. Any number of subpanels 282 may be aggregated together to provide for deployment specific customization. Similarly, any number of aggregate leakage containment panels 280 may be utilized to provide for customized containment formation for different deployment scenarios.

In one embodiment, the heights and/or widths of the subpanels 282 (or other panels) are adjustable (e.g., a modifiable width 284 and/or modifiable height 286). For example, the subpanels 282 may include portions that may extend and/or retract to modify the height and/or width of each of the subpanels 282 to provide for configuration of the subpanels 282 with respect to corresponding components. In other embodiments, a leakage detection panel may include such features for configuration to particular deployment scenarios.

Figure 3B:
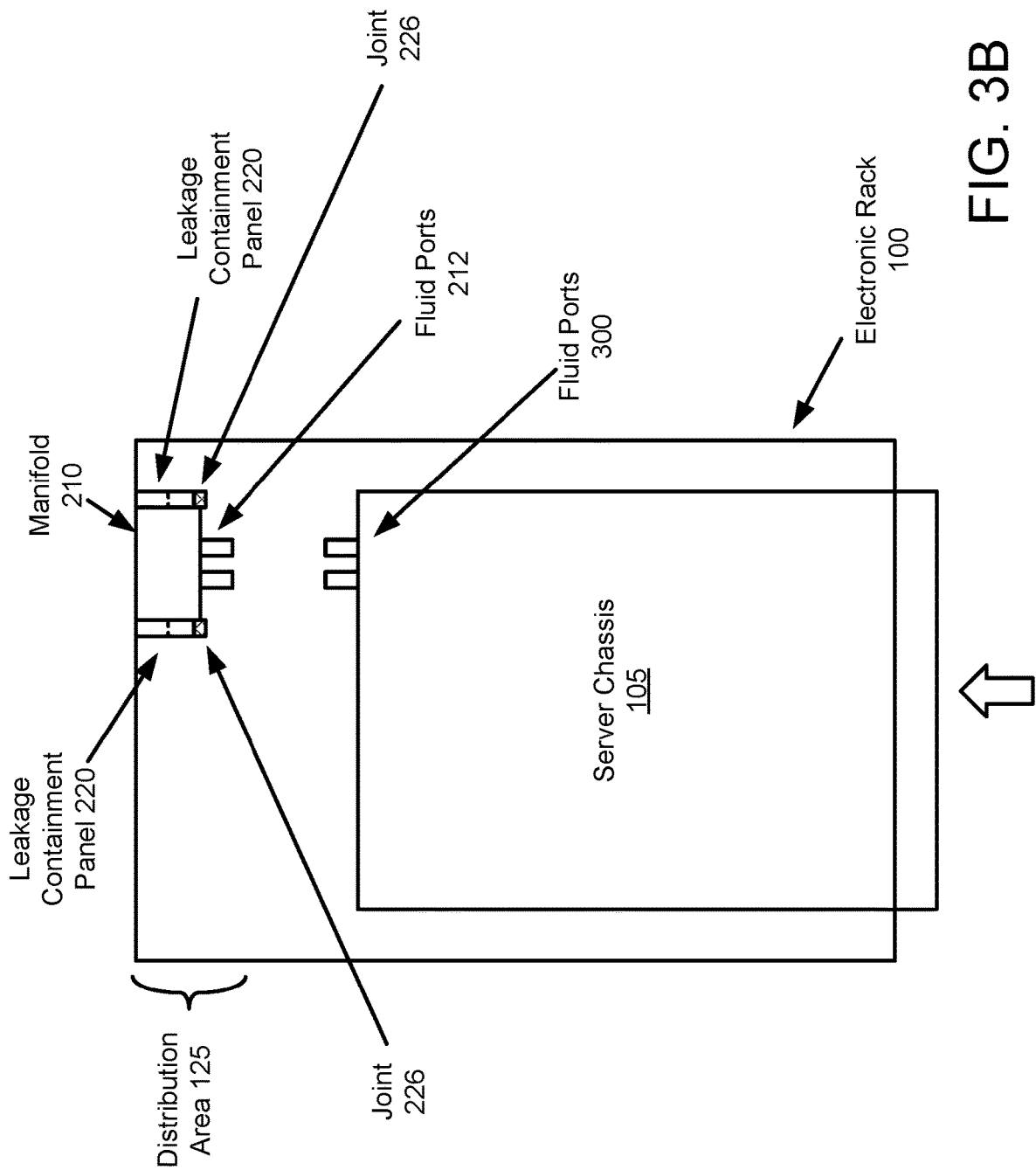
FIG. 3B shows a first top view diagram of an electronic rack, a cooling fluid distribution system, and a server chassis according to one embodiment.

Turning to FIG. 3A, a side view diagram of electronic rack 100 in accordance with one or more embodiments is shown. In FIG. 3A, the electronic rack 100 is shown in a scenario in which a fluid distribution system is positioned in the distribution area of the electronic rack 100. A similar top view diagram of electronic rack 100 in accordance with one or more embodiments is shown in FIG. 3B.

As seen in FIGS. 3A and 3B, when a server chassis 105 is not yet positioned in electronic rack 100, the leakage containment panels 220 may be in the first position to expose the fluid ports 212 to facilitate formation of fluid connection with fluid ports 300 of the server chassis. To form these fluid connections between the fluid ports, the server chassis 105 may be moved into the electronic rack 100 to place the fluid ports 212 in contact with the fluid ports 300.

These fluid ports may be implemented with blind mating connectors to allow the fluid connections to be made by merely pushing the server chassis 105 into position. Server chassis 105 may be positioned with various physical components of electronic rack 100 such as sliders, rails, etc. that allow server chassis 105 to be moved along a predetermined motion path. The predetermined motion path may be based on a standard such that the fluid ports 300 of server chassis 105 with automatically contact the fluid ports 212 in the distribution area. For example, the fluid ports 212 may be positioned at predetermined locations in distribution area 125 to facilitate the formation of these fluid connections by the movement of server chassis 105.

Figure 3C:
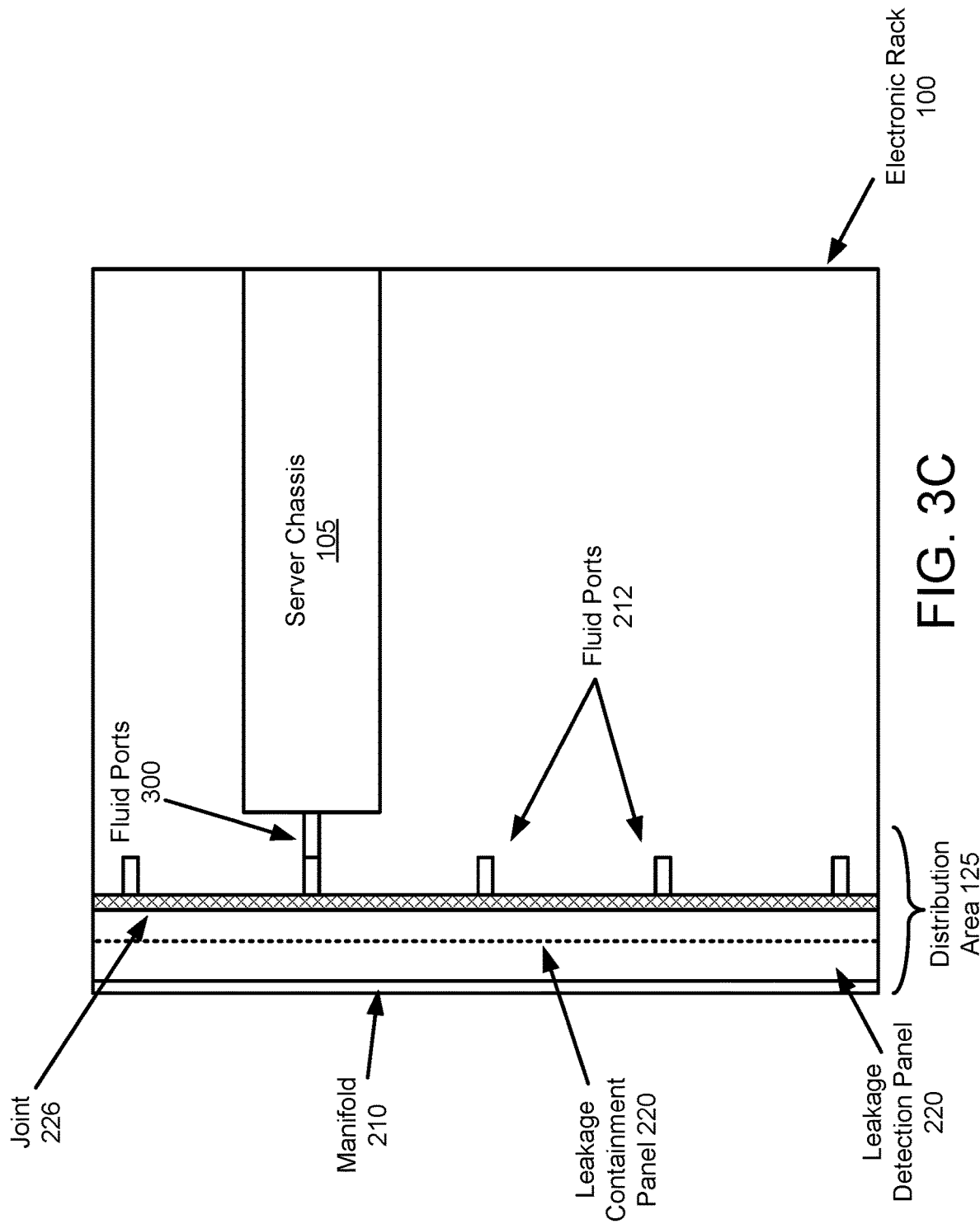
FIG. 3C shows a second side view diagram of an electronic rack, a cooling fluid distribution system, and a server chassis according to one embodiment.

Turning to FIG. 3C, a side view diagram of electronic rack 100 in accordance with one or more embodiments is shown. In FIG. 3C, the electronic rack 100 is shown in a scenario in which a fluid distribution system is positioned in the distribution area of the electronic rack 100 and a server chassis 105 has also been positioned in the electronic rack 100 to make a fluid connection to the fluid distribution system. A similar top view diagram of electronic rack 100 in accordance with one or more embodiments is shown in FIG. 3D.

Figure 3D:
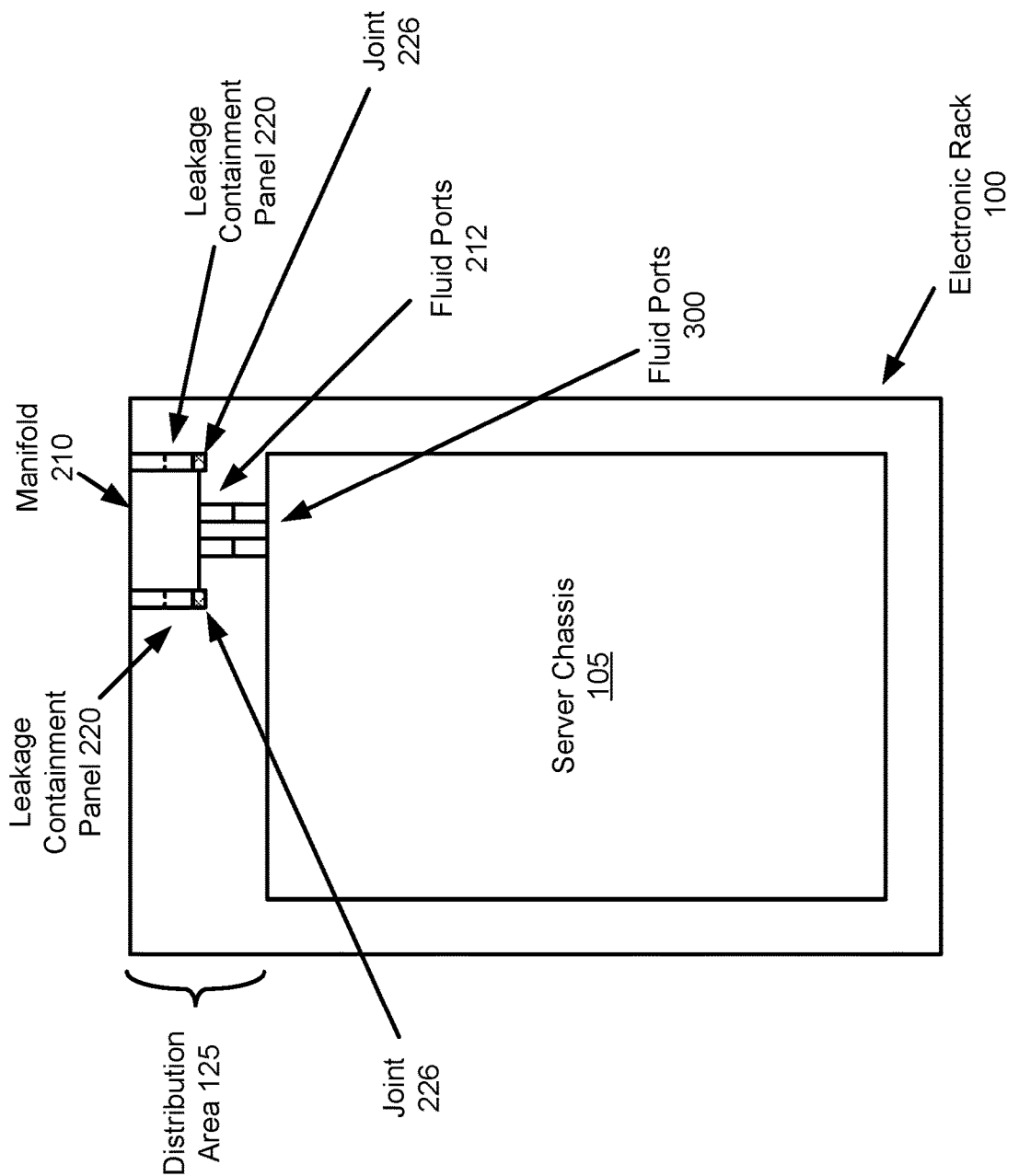
FIG. 3D shows a second top view diagram of an electronic rack, a cooling fluid distribution system, and a server chassis according to one embodiment.

As seen in FIGS. 3C and 3D, after a server chassis 105 is positioned in electronic rack 100, the leakage containment panels 220 may initially be in the first position to expose the fluid ports 212 to facilitate formation of fluid connection with the fluid ports 300 of the server chassis. The connections between the fluid ports 212, 300 may be made automatically by virtue of the movement of server chassis 105 or may be made manually by a person after the fluid ports 212, 300 are positioned with each other. For example, as seen in these figures, the fluid ports 212, 330 may be accessed from the side.

Figure 3E:
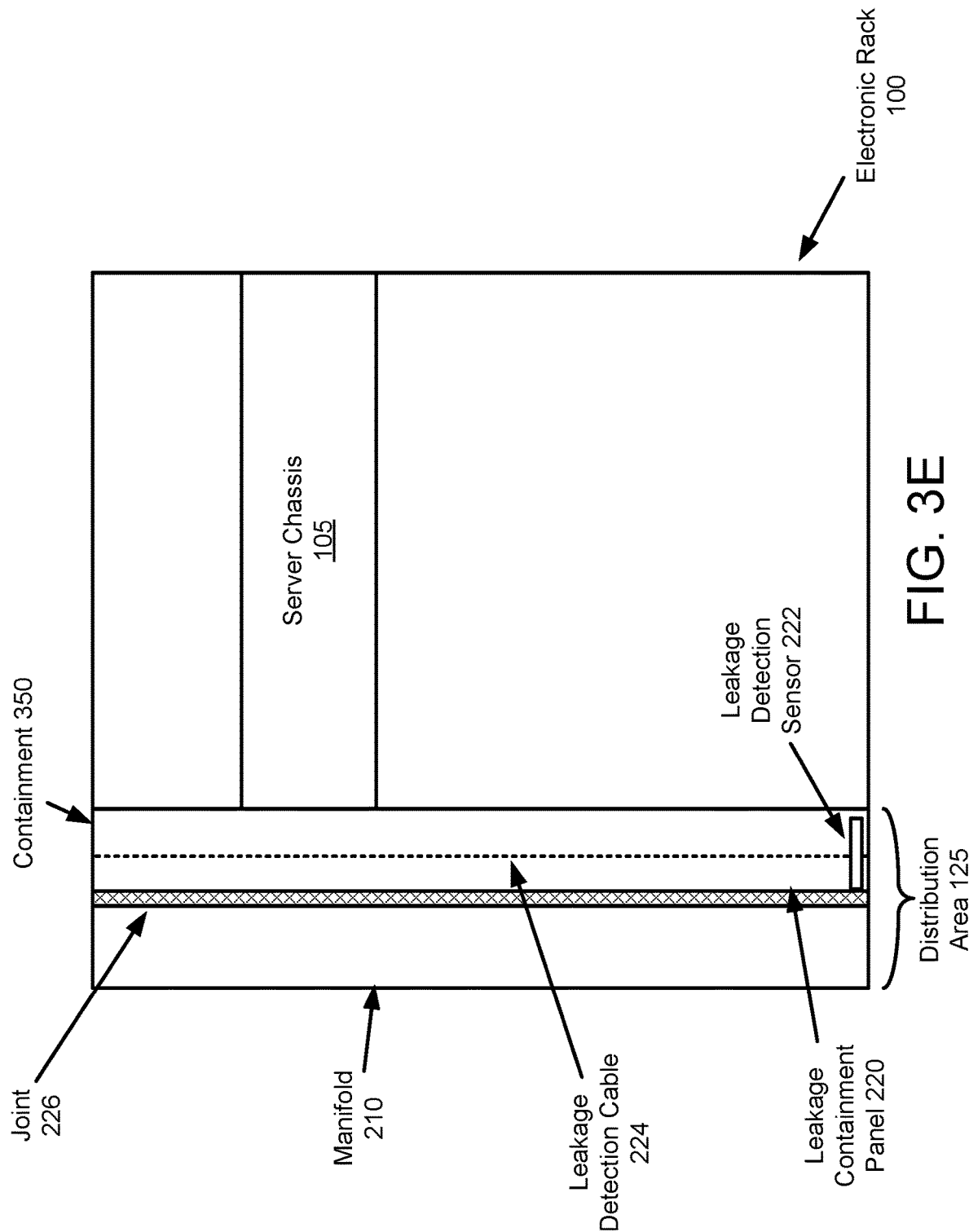
FIG. 3E shows a third side view diagram of an electronic rack, a cooling fluid distribution system, and a server chassis according to one embodiment.

Turning to FIG. 3E, a side view diagram of electronic rack 100 in accordance with one or more embodiments is shown. In FIG. 3E, the electronic rack 100 is shown in a scenario in which a fluid distribution system is positioned in the distribution area of the electronic rack 100, a server chassis 105 is also positioned in the electronic rack 100 to make a fluid connection to the fluid distribution system, and leakage containment panels 220 have been moved to a second position to form a containment. A similar top view diagram of electronic rack 100 in accordance with one or more embodiments is shown in FIG. 3F.

Figure 3F:
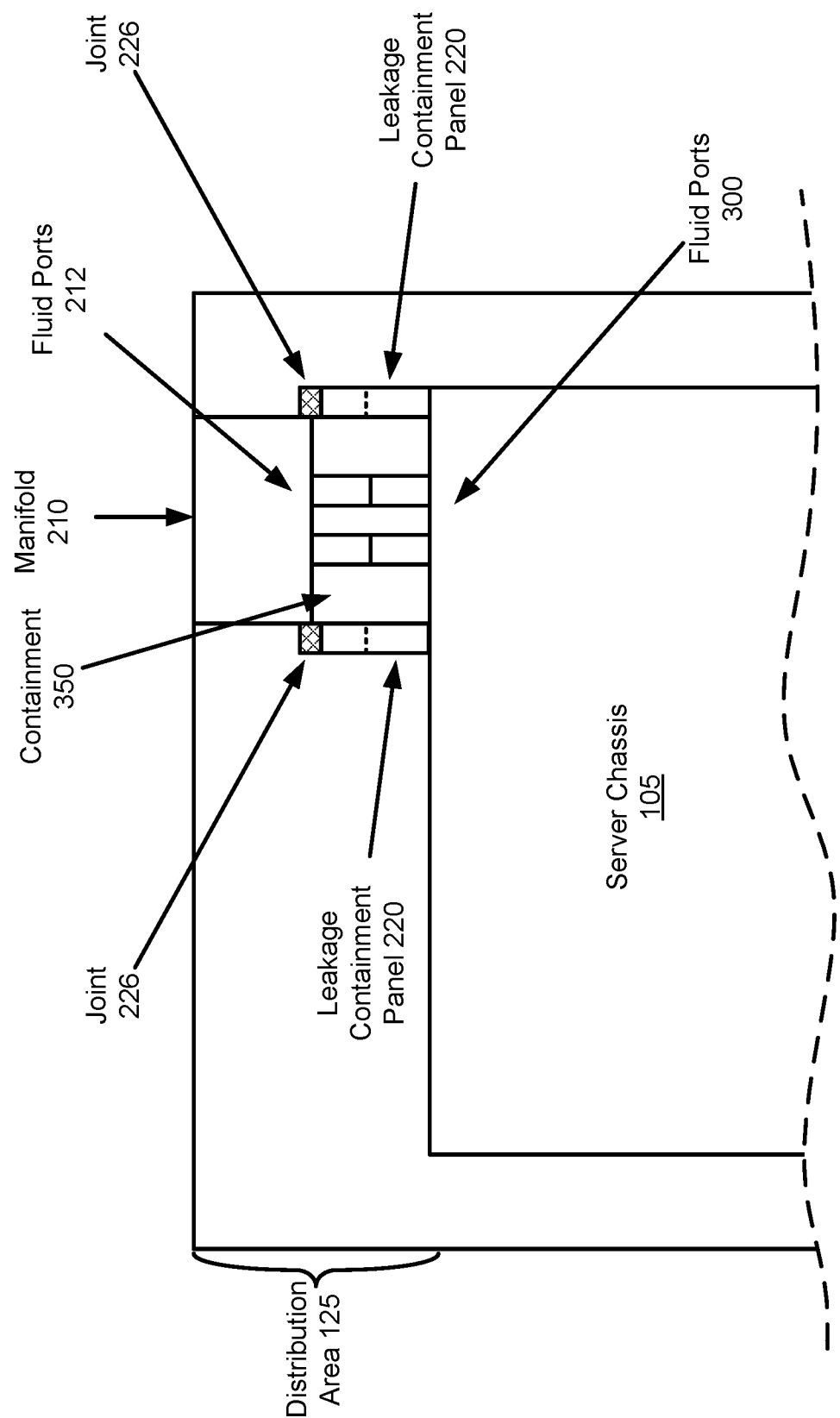
FIG. 3F shows a third top view diagram of an electronic rack, a cooling fluid distribution system, and a server chassis according to one embodiment.

As seen in FIGS. 3E and 3F, when the leakage containment panels 220 are moved to the second position (e.g., via rotation about joints 226), a containment 350 is formed. For example, the leakage containment panels 220 may be positioned on opposite side of the fluid ports 212, 300. The leakage containment panels 220 may also extend from the manifold 210 to (or near to) server chassis 105. Consequently, the containment 350 may contain cooling fluid that may leak (or otherwise escape) from the fluid ports 300, fluid ports 212, and/or other components that bound the containment 350 such as manifold 210. In the configuration as shown in FIGS. 3E and 3F, cooling fluid may be circulated to cooling modules or other components in server chassis 105 through the fluid ports 212, 300.

Figure 3G:
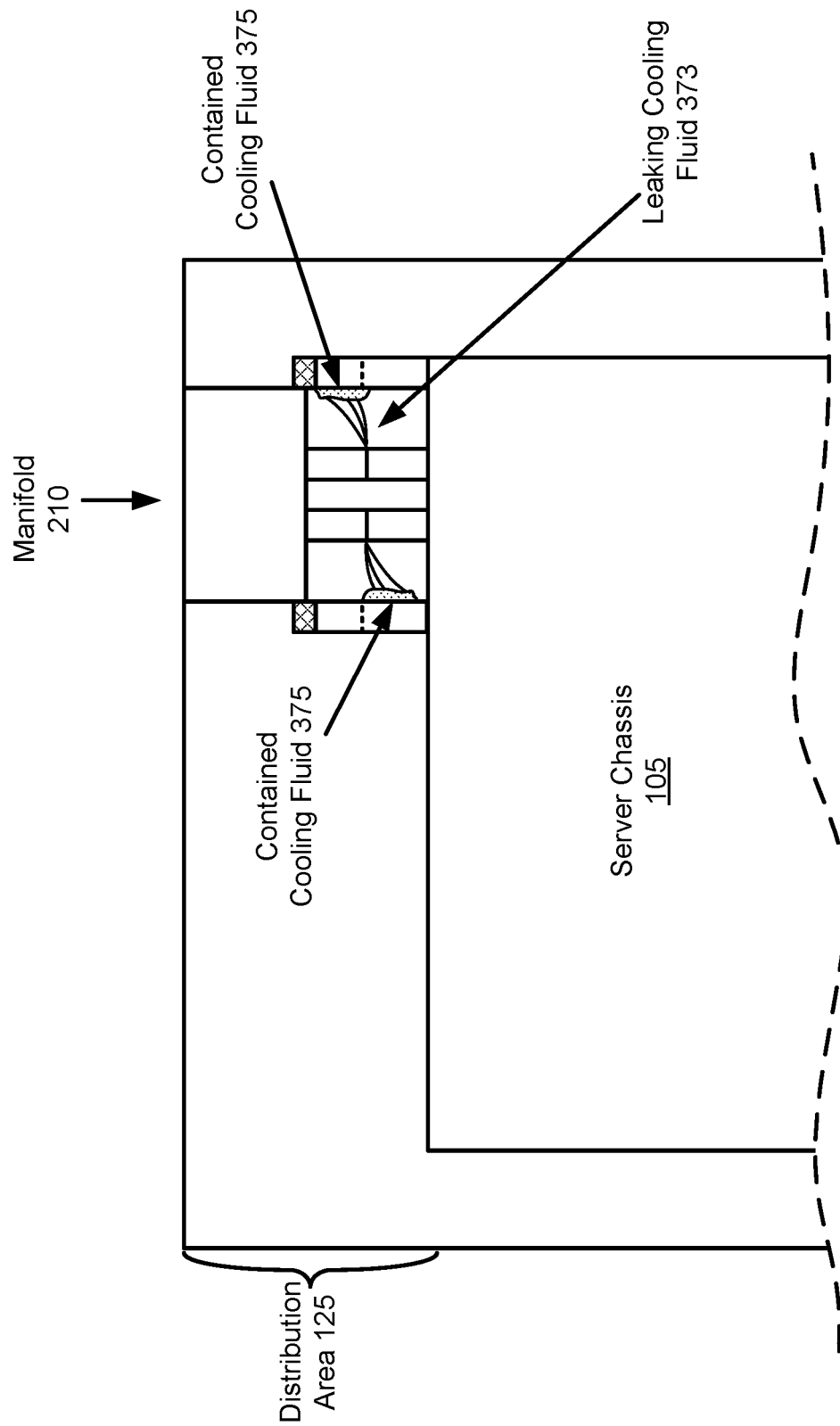
FIG. 3G shows a fourth top view diagram of an electronic rack, a cooling fluid distribution system, and a server chassis according to one embodiment.

Turning to FIG. 3G, a top view diagram of electronic rack 100 in accordance with one or more embodiments is shown. In FIG. 3G, a scenario in which an improper fluid connection between the fluid ports 212, 300 is made resulting in leaking cooling fluid 373 from these ports. As seen in FIG. 3G, when leaking cooling fluid 373 escapes near the fluid ports, it may spray outward resulting in it being deposited (at least in part) on the leakage containment panels 220. By doing so, contained cooling fluid 375 may be kept within the containment formed by the leakage containment panels.

By virtue of the connection between the leakage containment panels, the leakage containment panels may be able to accommodate different distribution area 125 topologies. For example, the leakage containment panels 220 may be partially extended rather than totally extended to accommodate different distribution area topologies. In some embodiments, various portions of the leakage containment panels may be retractable so as to facilitate partial extension or may provide for partial extension by virtue of the connection mechanism utilized to connect the leakage containment panels to other components.

Additionally, the leakage detection sensor 222 and leakage detection cable 224 of the leakage containment panels 220 may detect the presence of the contained cooling fluid 375. When the detection occurs, the leakage detection sensor 222 may report the leaked cooling fluid to a rack manager so that actin may be taken to reduce the impact of the leaked cooling fluid on the components positioned in electronic rack 100.

Figure 4:
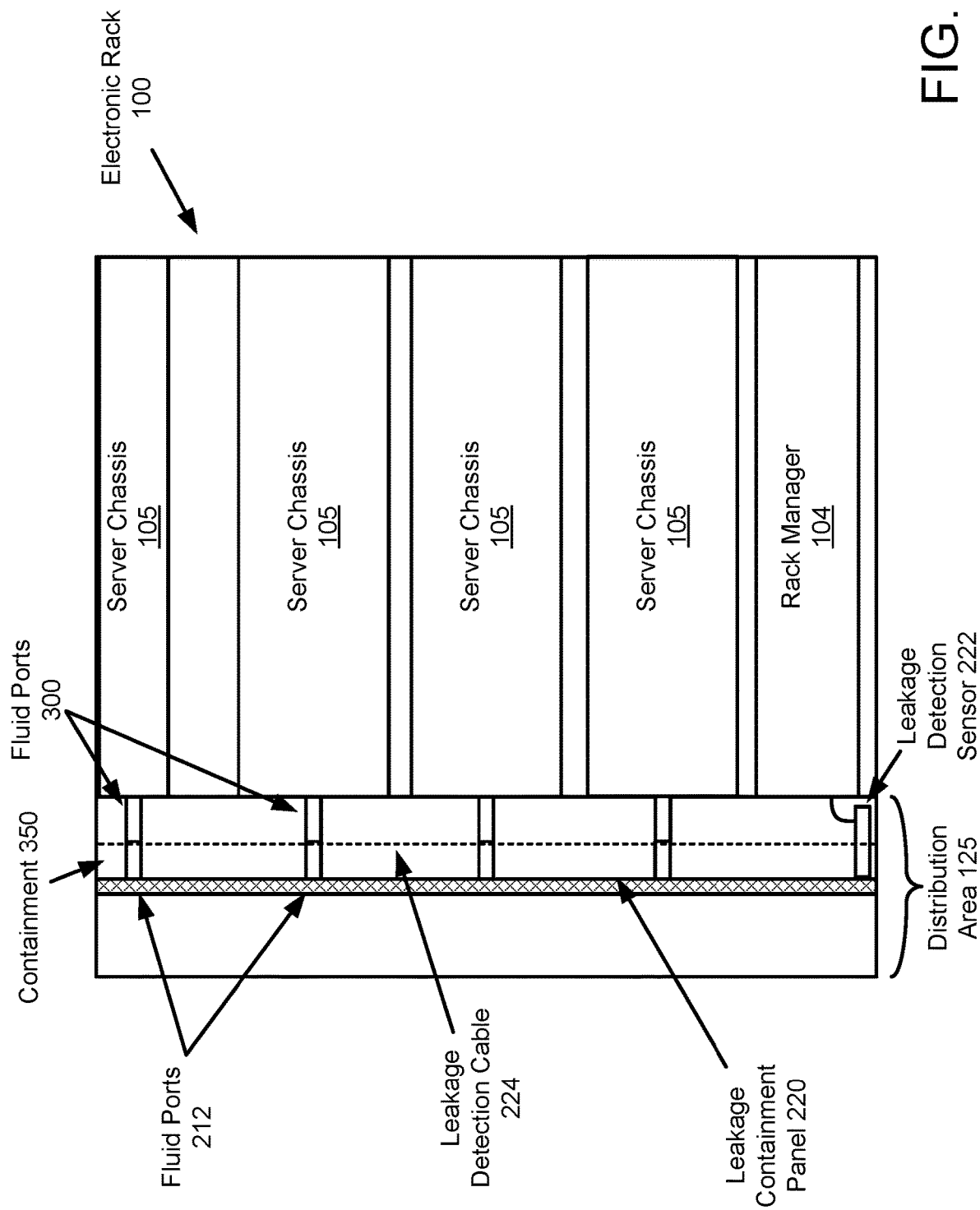
FIG. 4 shows a side top view diagram of an electronic rack, a cooling fluid distribution system, multiple server chassis, and a rack manager according to one embodiment.

Turning to FIG. 4, a side view diagram of electronic rack 100 in accordance with one or more embodiments is shown. In FIG. 4, a scenario in which multiple server chassis 105 and a fluid distribution system are positioned in electronic rack 100. In the scenario, the fluid ports 212, 300 are connected to each other, the leakage containment panels are in the second position to form a containment, and cooling fluid is being circulated to the server chassis. In FIG. 4, only an outline of leakage containment panels 220 is shown to illustrate the fluid ports 212, 300 which would otherwise be obscured from view in this figure by the leakage containment panels 220.

As seen in FIG. 4, multiple corresponding fluid ports 212, 300 may be connected to each other. The connections between the fluid ports may be stacked with respect to each other (e.g., above/below), like the stacking of the server chassis 105 in the electronic rack. In this manner, when the leakage containment panels 220 are moved from the first position to the second position to form a containment, multiple fluid port connections to multiple server chassis 105 may be positioned in the resulting containment 350.

Additionally, as seen in FIG. 4, a leakage detection sensor 222 may be positioned with the containment 350 to detect cooling fluid leaks from any of the connections in the containment. If a leak is detected, rack manager 104 may be notified through a wired connection (illustrated with the curved line between rack manager 104 and leakage detection sensor 222). Rack manager 104 may then take action to remediate or otherwise reduce the impact of the leaked cooling fluid. Because the rack manager 104 may not know from which fluid connection the detected cooling fluid is leaking, rack manager 104 may take electronic rack level action in response to the detection. For example, rack manager 104 may transfer workloads from the computing devices positioned in the server chassis 105 to other computing devices positioned in server chassis (not shown) positioned in other electronic racks (not shown). Rack manager 104 may shut off (e.g., after transferring workloads) power to the server chassis 105. Rack manager 104 may suspend or reduce a circulation rate of cooling fluid to the server chassis 105 (e.g., by operating pumps, valves, or other devices that manage cooling fluid circulation). Rack manager 104 may notify administrators or other management entities (e.g., data center level managers).

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling fluid distribution system, comprising:
   a rack manifold for circulating cooling fluid to devices positioned in a server chassis;
   connectors positioned on the rack manifold, in fluid communication with the rack manifold, and adapted to fluidly connect the devices with the rack manifold;
   leakage containment panels attached to the rack manifold and positioned on two sides of the connectors, each of the leakage containment panels being movable between an idle position and an active position to manage the cooling fluid; and
   a leakage detection sensor adapted to detect when the cooling fluid leaks from a fluid connection between the connectors and the devices.

2. The cooling fluid distribution system of claim 1, further comprising:
   a first joint which attaches a first leakage containment panel of the leakage containment panels and the rack manifold, the first joint being adapted for rotation of the first leakage containment panel between the idle position and the active position; and
   a second joint which attaches a second leakage containment panel of the leakage containment panels and the rack manifold, the second joint being adapted for rotation of the second leakage containment panel between the idle position and the active position.

3. The cooling fluid distribution system of claim 2, wherein the connectors are accessible from a side corresponding to the first joint while the first leakage containment panel is in the idle position, wherein the connectors are accessible from sides corresponding to the first joint and the second joint while the first leakage containment panel and the second leakage containment panel are in the idle position, and wherein a containment is removed while the first leakage containment panel and the second leakage containment panel are in the idle position.

4. The cooling fluid distribution system of claim 2, wherein the first leakage containment panel and the second leakage containment panel form a containment while the first leakage containment panel and the second leakage containment panel are in the active position, the containment limiting flow of the cooling fluid out of the containment to prevent the cooling fluid from being sprayed on other components due to a leak between one of the connectors and one of the devices.

5. The cooling fluid distribution system of claim 1, further comprising:
   a leakage detection cable positioned with one of the leakage containment panels to detect when the cooling fluid reaches the one of the leakage containment panels.

6. The cooling fluid distribution system of claim 5, wherein the leakage detection sensor is:
   operably connected to the leakage detection cable, and
   configured to report a leak of the cooling fluid is present when the leakage detection cable detects the cooling fluid.

7. The cooling fluid distribution system of claim 1, wherein the leakage detection sensor reports a leak of the cooling fluid to a rack management controller that manages flow of the cooling fluid in an electronic rack in which the cooling fluid distribution system is positioned.

8. The cooling fluid distribution system of claim 7, further comprising:
another leakage detection sensor, wherein the leakage detection sensors sensor and the other leakage detection sensor are positioned at different positions along a height of the leakage containment panels.

9. The cooling fluid distribution system of claim 8, further comprising:
a first holder positioned with the leakage detection sensor and a second holder positioned with the other leakage detection sensor, the first holder and the second holder positioning maintain the different positions of the leakage detection sensor and the other leakage detection sensor, and the first holder and the second holder each comprise a structural for collecting the cooling fluid to submerge one of the leakage detection sensor or the other leakage detection sensor while cooling fluid leaks from the rack manifold.

10. The cooling fluid distribution system of claim 1, wherein the leakage containment panels comprises a plurality of subpanels, wherein each of the plurality of subpanels has a shape adapted to a use case scenario of the cooling fluid distribution system.

11. An electronic rack, comprising:
a plurality of server chassis arranged in a stack, each of the plurality of server chassis comprising:
one or more cold plates associated with one or computing components; and
a cooling fluid distribution system comprising:
a rack manifold for circulating cooling fluid to the one or more cold plates,
connectors positioned on the rack manifold, in fluid communication with the rack manifold, and adapted to fluidly connect each of the plurality of server chassis with the rack manifold to circulate the cooling fluid to the one or more cold plates,
leakage containment panels attached to the rack manifold and positioned on two sides of the connectors, each of the leakage containment panels being movable between an idle position and an active position, and
a leakage detection sensor adapted to detect when the cooling fluid leaks from a fluid connection between the connectors and the plurality of server chassis.

12. The electronic rack of claim 11, wherein the cooling fluid distribution system further comprises:
joints that connect the leakage containment panels and the rack manifold, the joints being adapted for adjusting the leakage containment panels between the idle position and the active position.

13. The electronic rack of claim 12, wherein the leakage containment panels form a containment while the leakage containment panels are in the active position, the containment limiting flow of the cooling fluid out of the containment to prevent the cooling fluid from being sprayed on other components due to a leak between one of the connectors and one of the plurality of server chassis.

14. The electronic rack of claim 12, wherein the connectors are accessible from the two sides while the leakage containment panels are in the idle position, and a containment is removed while a first leakage containment panel of the leakage containment panels and a second leakage containment panel of the leakage containment panels are in the idle position.

15. The electronic rack of claim 11, wherein the cooling fluid distribution system further comprises:
a slide adapted to slide the leakage containment panels between the idle position and the active position.

16. A data center system, comprising:
a plurality of electronic racks, each of the plurality of electronic racks comprising:
a plurality of server chassis arranged in a stack, each of the plurality of server chassis comprising:
one or more cold plates associated with one or more computing components; and
a cooling fluid distribution system comprising:
a rack manifold for circulating cooling fluid to the one or more cold plates,
connectors positioned on the rack manifold, in fluid communication with the rack manifold, and adapted to fluidly connect each of the plurality of server chassis with the rack manifold to circulate the cooling fluid to the one or more cold plates,
leakage containment panels attached to the rack manifold and positioned on two sides of the connectors, each of the leakage containment panels being movable between an idle position and an active position, and
a leakage detection sensor adapted to detect when the cooling fluid leaks from a fluid connection between the connectors and the plurality of server chassis.

17. The data center system of claim 16, wherein the cooling fluid distribution system further comprises:
joints that connect the leakage containment panels and the rack manifold, the joints being adapted for adjusting of the leakage containment panels between the idle position and the active position.

18. The data center system of claim 17, wherein the cooling fluid distribution system further comprises:
a slide adapted to slide the leakage containment panels between the idle position and the active position.

19. The data center system of claim 16, wherein the leakage containment panels form a containment while the leakage containment panels are in the active position, the containment limiting flow of the cooling fluid out of the containment to prevent the cooling fluid from being sprayed on other components due to a leak between one of the connectors and one of the plurality of server chassis.

20. The data center system of claim 19, wherein the connectors are accessible from the two sides while the leakage containment panels are in the idle position, the containment is removed while a first leakage containment panel of the leakage containment panels and a second leakage containment panel of the leakage containment panels are in the idle position, and the connectors are inaccessible from the two sides while the leakage containment panels are in the active position.

* * * * *